US006326732B1

(12) United States Patent
Abadeer et al.

(10) Patent No.: US 6,326,732 B1
(45) Date of Patent: Dec. 4, 2001

(54) APPARATUS AND METHOD FOR NON-CONTACT STRESS EVALUATION OF WAFER GATE DIELECTRIC RELIABILITY

(75) Inventors: Wagdi W. Abadeer, Jericho, VT (US); Eduard A. Cartier, New York; James H. Stathis, Poughquag, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/250,880

(22) Filed: Feb. 16, 1999

(51) Int. Cl.$^7$ .................................................. H01J 7/24
(52) U.S. Cl. .............................. 315/111.81; 315/111.21; 324/671; 324/765; 437/235
(58) Field of Search ................... 315/111.21, 111.71, 315/111.81, 111.91; 324/671, 763, 765; 118/723 MW, 723 HC, 723 ER, 723 IR; 437/225, 235; 250/251; 156/643.1

(56) References Cited

U.S. PATENT DOCUMENTS

| | | | |
|---|---|---|---|
| 5,166,080 | 11/1992 | Schietinger et al. | 437/7 |
| 5,310,260 | 5/1994 | Schietinger et al. | 374/142 |
| 5,403,434 | * 4/1995 | Moslehi | 156/643 |
| 5,468,955 | * 11/1995 | Chen et al. | 250/251 |
| 5,498,974 | 3/1996 | Verkuil et al. | 324/767 |
| 5,528,153 | 6/1996 | Taylor et al. | 324/671 |
| 6,007,671 | * 12/1999 | Fujimura et al. | 156/345 |
| 6,049,213 | * 4/2000 | Abadeer | 324/719 |

OTHER PUBLICATIONS

"Mechanism for stress–induced leakage currents in thin silicon dioxide films," by D.J. DiMaria et al., J. Appl. Phys. 78(6), pp. 3883–3894 (Sep. 15, 1995).

"Atomic hydrogen–induced degradation of thin SiO2 gate oxides," by E. Cartier et al., Journal of Non–Crystalline Solids, 187, pp. 244–247 (1995).

"Trap creation in silicon dioxide produced by hot electrons," by D. J. MiMaria et al., J. Appl. Phys. 85(6), pp. 2342–2356 (Mar. 15, 1988).

"Non–intrusive optical detection of oxide precipitates in silicon," by J. Batchelder et al., IBM Technical Disclosure Bulletin vol. 32, No. 11, pp. 453–454 (Apr. 1990).

"Non–contact characterization of ultrathin dielectrics for the gigabit era," by P.K. Roy et al., Electro. Chem. Soc., Spring Mtg, Montreal, Canada, May 4–9, 1997, p 600, Abstract 478.

(List continued on next page.)

Primary Examiner—Haissa Philogene
(74) Attorney, Agent, or Firm—Ratner & Prestia; Tiffany L. Townsend, Esq.

(57) ABSTRACT

An apparatus and method for evaluating the performance of a test dielectric material for use as a gate dielectric. The method comprises exposing a coated layer of the dielectric to a concentration of atomic hydrogen. The method may comprise (a) measuring an initial value of interface-state density in the test dielectric, (b) exposing the coated test dielectric to a concentration of atomic hydrogen in a remote plasma, and then (c) measuring a post-exposure value of interface-state density in the test dielectric. Steps (b) and (c) may be repeated with incrementally higher concentrations of atomic hydrogen to determine a rate of change in interface-state density value as a function of atomic hydrogen concentration, which may then be related to the projected charge-to-breakdown or time-to-breakdown of the test dielectric layer when the dielectric is used as the gate dielectric. The method may be conducted on a remote-plasma hydrogen exposure apparatus comprising, in series, a source of a mixture of molecular and atomic hydrogen gas; a particle remover adapted to remove energetic, charged particles; a light sink; a hydrogen recombination device; and a wafer exposure chamber.

17 Claims, 5 Drawing Sheets

OTHER PUBLICATIONS

"Interface defect formation in MOSFETs by atomic hydrogen exposure," by R.E. Stahlbush et al., IEEE Transactions on Nuclear Science, vol. 41, No. 6, Dec. 1994, pp. 1844–1853.

"Atomic hydrogen–induced interface degradation of reoxidized nitrided silicon dioxide on silicon," by E. Cartier et al., Appl. Phys. Lett. 64(7), pp. 901–903 (Feb. 14, 1994).

"Explanation for the oxide thickness dependence of breakdown characteristics of metal–oxide–semiconductor structures," by D.J. DiMaria, Microelectronic Engineering 36, pp. 317–320 (1997).

"Elimination and generation of Si–SiO2 interface traps by low temperature hydrogen annealing," by L.D. Thanh et al., J. Electrochem. Soc.: Solid State Science & Tech., pp. 1797–1801 (Jul. 1988).

"Passivation and depassivation of silicon dangling bonds at the Si/Sio2 interface by atomic hydrogen," by E. Cartier et al., App.1 Phys. Lett. 63 (11), pp. 1510–1512 (Sep. 13, 1993).

"Atomic hydrogen–induced degradation of the Si/SiO2 structure," by E. Cartier et al., Microelectronic Engineering 28, pp. 3–10 (1995).

"Degradation of thin SiO2 gate oxides of atomic hydrogen," by E. Cartier et al., IBM Technical Disclosure Bulletin 11, pp. 453–454 (Apr. 1990).

"Ultimate limit for defect generation in ultra–thin silicon dioxide," by D.J. DiMaria et al.,Appl. Phys. Lett. 71 (22), pp. 3230–3232 (Dec. 1, 1997).

"Rapid contactless method for measuring fixed oxide charge associated with silicon processing," by R.L. Verkuil, IBM Technical Disclosure Bulletin Vo. 24, No. 6, pp. 3048–3053 (Nov. 1981).

* cited by examiner

APPARATUS AND METHOD FOR NON-CONTACT STRESS EVALUATION OF WAFER GATE DIELECTRIC RELIABILITY

TECHNICAL FIELD

The present invention relates generally to evaluation of wafer gate dielectric reliability in semiconductor products and, more specifically, to an apparatus and method for gathering accelerated life stress data for evaluation of wafer gate dielectric reliability.

BACKGROUND OF THE INVENTION

Thin gate dielectric reliability and integrity constitute one of the major challenges and concerns for the development and manufacturing of VLSI (very large scale integration) and ULSI (ultra large scale integration) semiconductor products. The development of reliable and high quality thin gate dielectrics requires a research- and time-intensive effort to meet continuously evolving competitive demands for smaller device geometries and better performance and reliability. As the thickness of the gate dielectric continues to be reduced to meet industry demands, continuous process improvements are necessary to meet yield and reliability criteria. The selection of optimum gate dielectric processes demands an intensive effort to collect life stress data on the wafers produced by the various processes.

It is currently known to collect life stress data using a chip-by-chip stress procedure in which each chip is contacted with a probe, one at a time, to measure the effects of lifetime-accelerated voltage and temperature conditions. A wafer typically contains a plurality of chips repeatedly patterned across its surface, a chip being a basic integrated circuit device unit. All chips on a wafer are initially tested at actual-use voltage conditions to establish the initial quality of gate dielectric. Then, voltage and temperature stresses are applied to each chip for a certain amount of time ranging from a few minutes to several hours or more. After the application of accelerated life stress conditions, the chips are tested again, and a significant increase in gate leakage from its initial value signifies dielectric breakdown.

Using advanced modeling, the stress data is then extrapolated to a projection of reliability under actual-use conditions. This projection is used to make comparisons between various process options. Because the manufacturing process does not permit time-consuming testing of each chip of every wafer produced, random sampling with relatively short testing periods is required. Still, the chip-by-chip contacting system is a labor- and time-intensive process and contributes significantly to the overall development cost. An evaluation procedure is needed whereby the quality of the dielectric on the whole wafer may be evaluated, especially an evaluation procedure that may be conducted before the fabrication of the electronic devices.

SUMMARY OF THE INVENTION

To meet this and other needs, and in view of its purposes, the present invention provides a method for evaluating the performance of a test dielectric material for use as a gate dielectric. The method comprises exposing a coated layer of the dielectric to a concentration of atomic hydrogen. The method also may comprise (a) measuring an initial value of interface-state density in the test dielectric, (b) exposing the coated test dielectric to a concentration of atomic hydrogen in a remote plasma, and then (c) measuring a post-exposure value of interface-state density in the test dielectric. The method may further comprise (d) repeating steps (b) and (c) at least one more time with an incrementally higher concentration of atomic hydrogen each time steps (b) and (c) are repeated; and (e) determining a rate of change in interface-state density value as a function of atomic hydrogen concentration. The method may then comprise relating the rate of change in interface-state density value to projected charge-to-breakdown or time-to-breakdown of the test dielectric layer for use of the dielectric as the gate dielectric.

The method of the present invention may be conducted on a remote-plasma hydrogen exposure apparatus, comprising, in series, a source of a mixture of molecular and atomic hydrogen gas; a particle remover adapted to remove energetic, charged particles; a light sink; a hydrogen recombination device; and a wafer exposure chamber. It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF INVENTION

Figure 1:
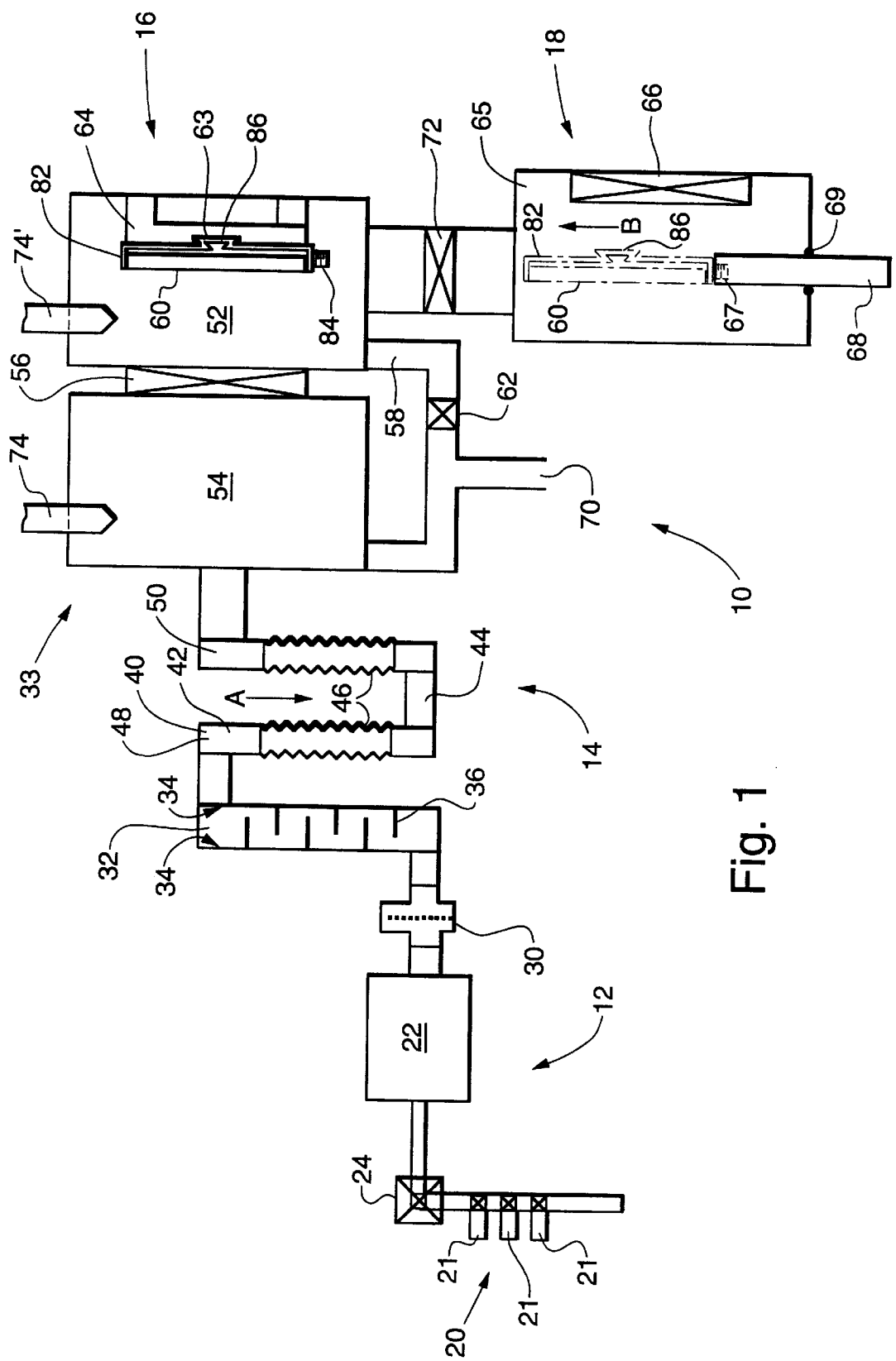
FIG. 1 is a schematic illustration of an exemplary remote-plasma hydrogen exposure apparatus according to the present invention.

Referring now to the drawing, in which like reference numerals refer to like elements throughout, FIG. 1 illustrates an exemplary remote-plasma hydrogen exposure apparatus 10. The apparatus as illustrated comprises, in series, four general parts: a gas inlet system 12, a gas conditioning system 14, a wafer exposure area 16, and optionally, a load-lock system 18.

Gas inlet system 12 provides a source of a mixture of molecular and atomic hydrogen gas. The inlet system comprises a source of molecular hydrogen gas connected to inlet manifold 20 and an atomic hydrogen production unit 22 adapted to produce atomic hydrogen from the molecular hydrogen. Inlet manifold 20, as shown in FIG. 1, may comprise multiple inlet connections 21, so that the hydrogen may be connected to one inlet connection and other gases, such as argon or helium, may be connected to the remaining inlet connections to facilitate mixing of the hydrogen with other gases.

Atomic hydrogen production unit 22 may comprise, for example, a plasma source such as a microwave discharge in a quartz tube, or a hydrogen cracker such as a hot tungsten filament, both of which are known in the art. Gas flow may be controlled by microvalve 24.

Gas conditioning system 14 comprises a particle remover 30 adapted to remove energetic, charged particles; a light sink 32; and a hydrogen recombination device 33. Particle remover 30 may be an electrostatic grid across a drift tube adapted to collect ions of a particular charge according to a voltage polarity on the grid. For instance, electrostatic grid particle remover 30 may collect positive ions and confine negative ions to the gas inlet system, or vice versa, depending on the voltage polarity on the grid.

Light sink 32 may be a transport tube, as shown in FIG. 1, having interior walls 34 and containing light baffles 36. Interior walls 34 and light baffles 36 may be coated with a hydrogen recombination inhibitor, such as polytetrafluoroethylene (PTFE). The baffled transport tube light sink 32 removes light by multiple reflection and absorption. The light intensity decreases exponentially with the number of light baffles 36 in the tube. The PTFE coating suppresses hydrogen recombination on the walls of the transport tube, so that the amount of atomic hydrogen can be maximized.

The step of conditioning the gas to remove energetic, charged particles and light (specifically UV radiation) is necessary to avoid uncontrollable stress on the wafer. Both UV radiation and charged or energetic particles are known to degrade gate oxides. Thus, these degradation mechanisms must be eliminated so that only stresses created by atomic hydrogen exposure are present.

Hydrogen recombination device 33 may further comprise a metal-walled tube 40 having a variable length, such as the set of bellows shown in FIG. 1. The bellows comprise a fixed section 42 and a movable section 44 connected by flexible sections 46. As movable section 44 traverses in the direction as shown by arrow "A", the overall length of tube 40 from entry 48 to exit 50 increases. When movable section 44 traverses in the direction opposite arrow "A", the length of tube 40 decreases.

Recombination device 33 reduces and adjusts the atomic hydrogen density in the gas mixture to a desired value. Atomic hydrogen efficiently recombines on metal walls, and so the degree of recombination can be controlled simply by varying the length of tube 40. A set of bellows enables significant variation of the tube length, thus providing gas ratio control over several orders of magnitude.

The wafer exposure area 16 comprises a wafer exposure chamber 52. Recombination device 33 may further comprise a pre-exposure chamber 54 in series with exposure chamber 52. An exposure valve 56 is placed between the two chambers 52, 54. A bypass 58 connecting chambers 52 and 54 may be present to enable the pressure to be equalized between the chambers without opening exposure valve 56. Vacuum line 70 is connected to a vacuum source (not shown) to keep the system operating under vacuum, typically maintaining an internal pressure of approximately $10^{-3}$ Torr in apparatus 10.

A wafer 60 and a corresponding wafer holder 82 are shown in FIG. 1 positioned in exposure chamber 52 with solid lines and positioned in load-lock chamber 65 with broken lines because the wafer and wafer holder are not in both positions simultaneously. Bypass 58 is preferably metal-walled and long enough that full recombination occurs before the gas reaches exposure chamber 52, so that wafer 60, as shown in FIG. 1 with solid lines, is not exposed to atomic hydrogen while the pressure is being equalized. Bypass 58 further comprises a block valve 62 that is opened to equalize pressure, but remains closed during wafer exposure.

Inside exposure chamber 52, wafer 60 is mounted to wafer holder 82, which is in turn mounted to a heatable chuck 64. Wafer holder 82 further comprises a connector 84, which may be a male threaded coupling as shown in FIG. 1, adapted to mate to a connector 67, such as a female threaded coupling, on the top of transport mechanism 68. Wafer holder 82 may further comprise a shaped ridge 86 adapted to fit into a mating groove 63 in chuck 64.

Load-lock system 18 is adapted to allow removal of wafer 60 and attached wafer holder 82 from wafer exposure chamber 52 and reloading of another wafer without stopping the gas flow. Door 66 on load-lock chamber 65 opens to enable wafer 60 and wafer holder 82, as shown in FIG. 1 with broken lines, to be unloaded from or a new wafer and wafer holder to be loaded onto transport mechanism 68. For a wafer holder 82 such as is shown in FIG. 1, loading or unloading comprises screwing or unscrewing wafer holder connector 84 onto transport mechanism connector 67. To prevent atmospheric air from leaking into load-lock chamber 65, transport mechanism 68 as shown in FIG. 1 includes a seal 69 where transport mechanism 68 pierces load-lock chamber 65. Other types of transport mechanisms, such as a magnetic-based system, may also be used that may or may not require such a seal.

During the unloading operation, door 66, block valve 62, and exposure valve 56 are closed and load-lock valve 72 is opened to enable transport mechanism 68 to extend along arrow "B" into exposure chamber 52 to procure wafer 60, as shown with solid lines in FIG. 1. For a threaded wafer holder 82, such as is shown in FIG. 1, transport mechanism 68 is twisted to screw into wafer holder 82, and then transport mechanism 68 is moved to slide ridge 86 out of groove 63. Once wafer holder 82 is free from chuck 64, transport mechanism 68 may then be retracted in the direction opposite arrow "B" to put wafer 60, as shown with broken lines in FIG. 1, in reach of door 66. Load-lock valve 72 is closed, door 66 is opened, the old wafer 60 is removed, and a new wafer is placed on transport mechanism 68 in its place.

The loading procedure comprises a reverse procedure from the unloading procedure: door 66 is closed, load-lock valve 72 is opened, transport mechanism 68 is inserted in the direction of arrow "B", and wafer holder 82 is mounted on chuck 64. After wafer 60 and wafer holder 82, as shown with solid lines in FIG. 1, are mounted on chuck 64, transport mechanism 68 is retracted, load-lock valve 72 is closed, and block valve 62 is opened. Once the pressure is equalized between exposure chamber 52 and pre-exposure chamber 54, exposure valve 56 is opened and block valve 62 is closed to begin exposure of the new wafer.

The ratio of atomic and molecular hydrogen in pre-exposure chamber 54 and exposure chamber 52 may be measured using bolometric sensors 74 and 74', which may be silver-coated thermocouples. Atomic hydrogen has a high sticking and recombination coefficient on silver, and the heat produced by such recombination is a direct measure of the atomic hydrogen concentration. For starting up the apparatus, exposure valve 56 is closed and block valve 62 is open so that the vacuum pulled through vacuum line 70 can bring chambers 52 and 54 to equilibrium. Once the surfaces of the sensor 74 have been conditioned and a stable, desired ratio of gases is reached in pre-exposure chamber 54, exposure valve 56 is opened and block valve 62 is closed to begin wafer exposure.

A remote-plasma hydrogen exposure apparatus, such as apparatus 10 described above, may be used to conduct a method of the present invention. The method evaluates the reliability and integrity of a gate dielectric on a sample wafer by exposing a coated layer of the dielectric to a concentration of atomic hydrogen. Several studies have indicated that the release of hydrogen and its reactions are a major source for hot-electron degradation leading to dielectric breakdown. It has also been shown, by E. Cartier, D. A. Buchanan, and G. J. Dunn, in "Atomic Hydrogen-Induced Interface Degradation of Reoxidized-Nitrided Silicon Dioxide on Silicon," Appl. Phys. Lett. 64(7), pages 901–03 Feb. 14, 1994), that degradation of gate dielectrics by atomic hydrogen has characteristics similar to degradation induced by hot electron stressing.

Figure 2:
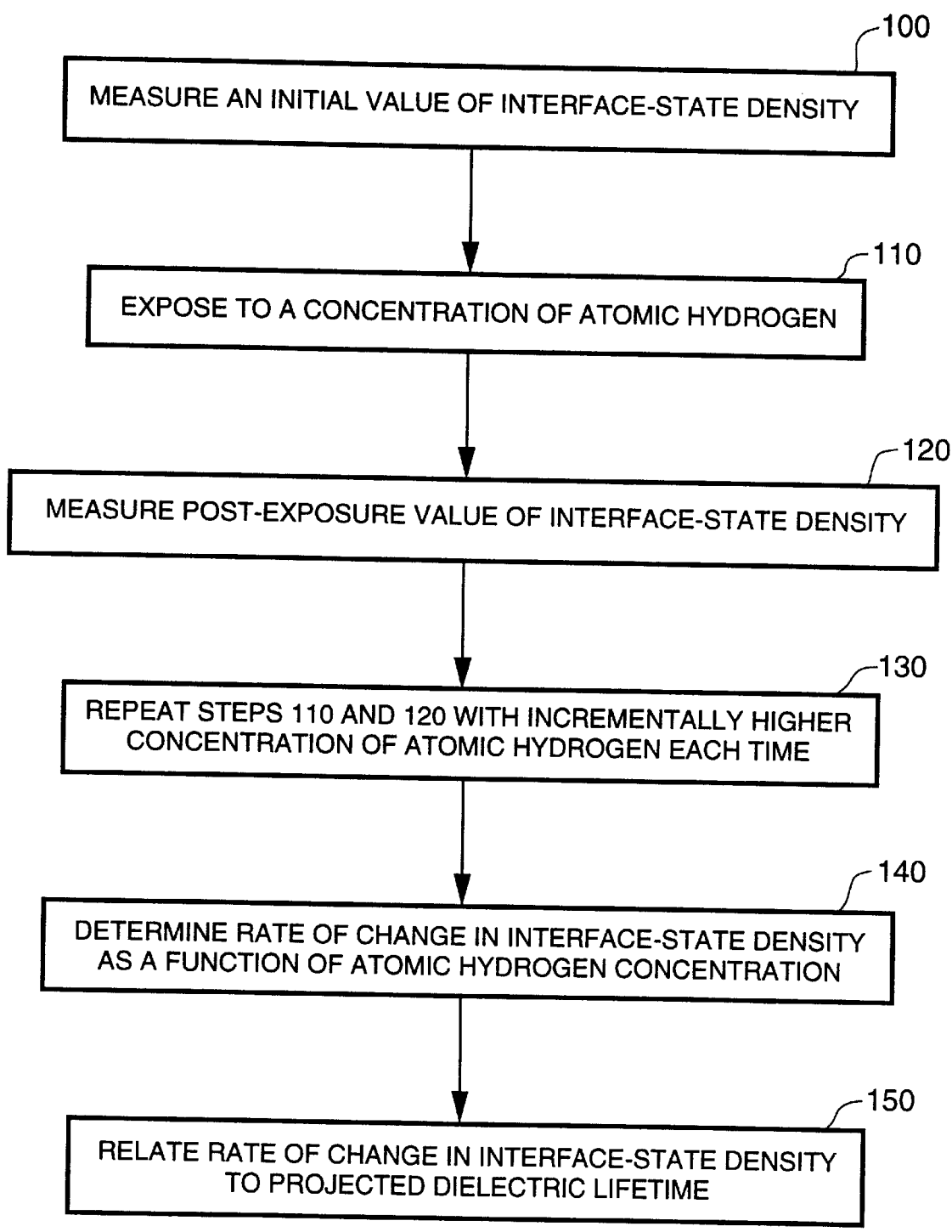
FIG. 2 is a flowchart of an exemplary method of the present invention.

Referring now to FIG. 2, there is shown a flowchart depicting an exemplary method in accordance with the present invention. The method comprises, at step 100, first measuring an initial value of interface-state density in the gate dielectric. Then, at step 110, the sample wafer is exposed to a concentration of atomic hydrogen in a remote plasma. This exposure in step 110 may include using remote-plasma hydrogen exposure apparatus 10 as shown in FIG. 1 and as described above. Next, in step 120, the post-exposure value of interface-state density in the gate dielectric is measured. At step 130, steps 110 and 120 are repeated with an incrementally higher concentration of atomic hydrogen each time the steps are repeated, until a satisfactorily high concentration has been reached. At step 140, the rate of change in interface-state density as a function of atomic hydrogen concentration is determined. Finally, at step 150, the rate of change in interface-state density is related to a projected dielectric lifetime. Specifically, step 150 may comprise relating the rate of change in interface-state density to the charge-to-breakdown or time-to-breakdown of the dielectric.

Exposure of a wafer to atomic hydrogen induces a stress on the thin gate dielectric that is effectively equivalent to and can be correlated with conventional life-time stress data gathered by applying a stress voltage to the gate dielectric by contacting methods known in the art. This correlation can be derived as described below.

Figure 3:
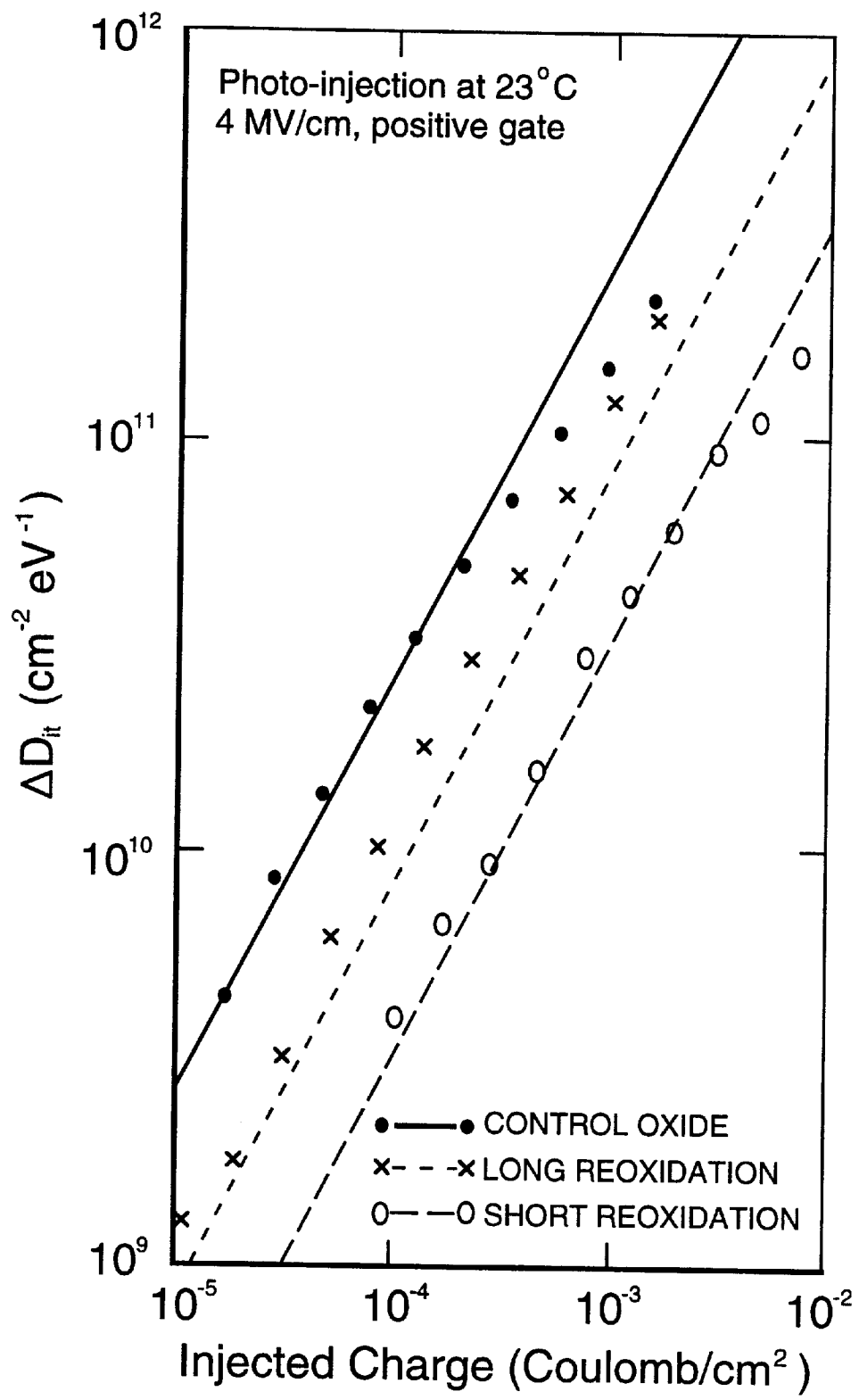
FIG. 3 is a graph of injected charge density versus change in interface-state density as measured by conventional contacting methods using photoinjection at 23° C. with an electric field of 4 MV/cm (positive gate) applied to the gate electrode.

Conventional voltage stress techniques comprise applying a voltage, and hence an electric field, by contacting the thin gate dielectric electrode. The stress is applied for a period of time and both the Change in Interface State Density ($\Delta D_{it}$) and the Charge-to-Breakdown ($Q_{bd}$) and hence the Time-to-Breakdown ($t_{bd}$) are determined. FIG. 3 shows the typical results for $\Delta D_{it}$ versus injected charge ($Q_{inj}$) for three different dielectric processes. Each specific dielectric process affects the magnitude of degradation under a certain applied electric field, as shown in FIG. 3. Thus, the relationship between $\Delta D_{it}$ and $Q_{inj}$ can be expressed as shown in Equation 1:

$$\ln(\Delta D_{it}) = [k \times \ln(Q_{inj})] + \ln(Ap) \tag{1}$$

where k and Ap are constants, and Ap is a function of the dielectric quality and processing conditions. From Equation 1, Equations 2 and 3 can be obtained:

$$\ln(\Delta D_{it}) = \ln[Ap \times Q_{inj}^k] \tag{2}$$

$$\Delta D_{it} = Ap \times Q_{inj}^k \tag{3}$$

where for process 1 the value of Ap will be $Ap_1$, for process 2 the value of Ap will be $Ap_2$, and so on.

According to the conventional stress procedure $Q_{bd}$ is given by Equation 4:

$$Q_{bd} = \frac{qN^{BD}(T_{ox}, Temp)}{P_{gen}(V, [Process], Temp)} \tag{4}$$

where q is the electron charge and $N^{BD}$ is the critical defect density at breakdown and is a function of dielectric thickness $T_{ox}$ and temperature, but is not a function of the dielectric processing conditions.

$P_{gen}$ is the defect generation probability, which is a function of the processing conditions, as well as a function of the stress voltage and temperature. The generation probability is given by Equation 5:

$$P_{gen} \triangleq \frac{\Delta D_{it}}{\Delta Q_{inj}} \triangleq \frac{(\Delta J / J_o)}{\Delta Q_{inj}} \tag{5}$$

where $\Delta J/J_o$ is the relative change in the stress-induced leakage current, and $\Delta D_{it}$ is the change in interface state density as before. As shown in Equation 5, $P_{gen}$ is process dependent. Thus, for a certain $\Delta J/J_o$, a first process (Process 1) may require an injected charge having a value $Q_{inj1}$ whereas a second process (Process 2) may require an injected charge having a value $Q_{inj2}$.

Dielectrics produced by Processes 1 and 2 but having the same thickness and stressed at the same stress conditions of voltage and temperature thus have the following relationship, using Equations 4 and 5:

$$\frac{Q_{bd1}}{Q_{bd2}} = \frac{qN^{BD} \times P_{gen2}}{P_{gen1} \times qN^{BD}} \tag{6}$$

$$\frac{Q_{bd1}}{Q_{bd2}} = \frac{P_{gen2}}{P_{gen1}} = \frac{(\Delta J/J_o) \times Q_{inj1}}{Q_{inj2} \times (\Delta J/J_o)} \tag{7}$$

$$\frac{Q_{bd1}}{Q_{bd2}} = \frac{Q_{inj1}}{Q_{inj2}} \tag{8}$$

where $N^{BD}$ is the same for Processes 1 and 2, and $Q_{inj1}$ and $Q_{inj2}$ are the injected charges for Processes 1 and 2, respectively, required to reach the same level of degradation $\Delta J/J_o$ or $\Delta D_{it}$.

For a hydrogen exposure non-contact stress system, $\Delta D_{it}$ due to hydrogen exposure can be expressed as shown in Equation 9:

$$\Delta D_{it} = \Delta D_{it}^x [1 - \exp(1 - \exp(-\beta \phi_H^\circ t))] \tag{9}$$

where $\Delta D_{it}^x$ is the maximum number of interface states that can be created by hydrogen dose and is independent of dielectric processing conditions. $\phi_H^\circ$ is the atomic hydrogen flux into the interfacial region, and t is the exposure time. $\beta$ is a constant that is dependent on dielectric processing conditions. Equation 9 can also be written as shown in Equation 10:

$$\Delta D_{it} = \Delta D_{it}^x [1 - \exp(-\beta H^\circ)] \tag{10}$$

where $H^\circ$ is the hydrogen dose.

For hydrogen dose values well below saturation, Equation 10 can be written as shown in Equation 11:

$$\Delta D_{it} = \Delta D_{it}^x [1 - 1 + (\beta H^\circ)] \Delta D_{it} = \Delta D_{it}^x \beta H^\circ \tag{11}$$

The relative change in interface states with respect to hydrogen dose is given by:

$$\frac{\Delta D_{it}}{H^o} = \Delta D_{it}^x \beta \quad (12)$$

Figure 4:
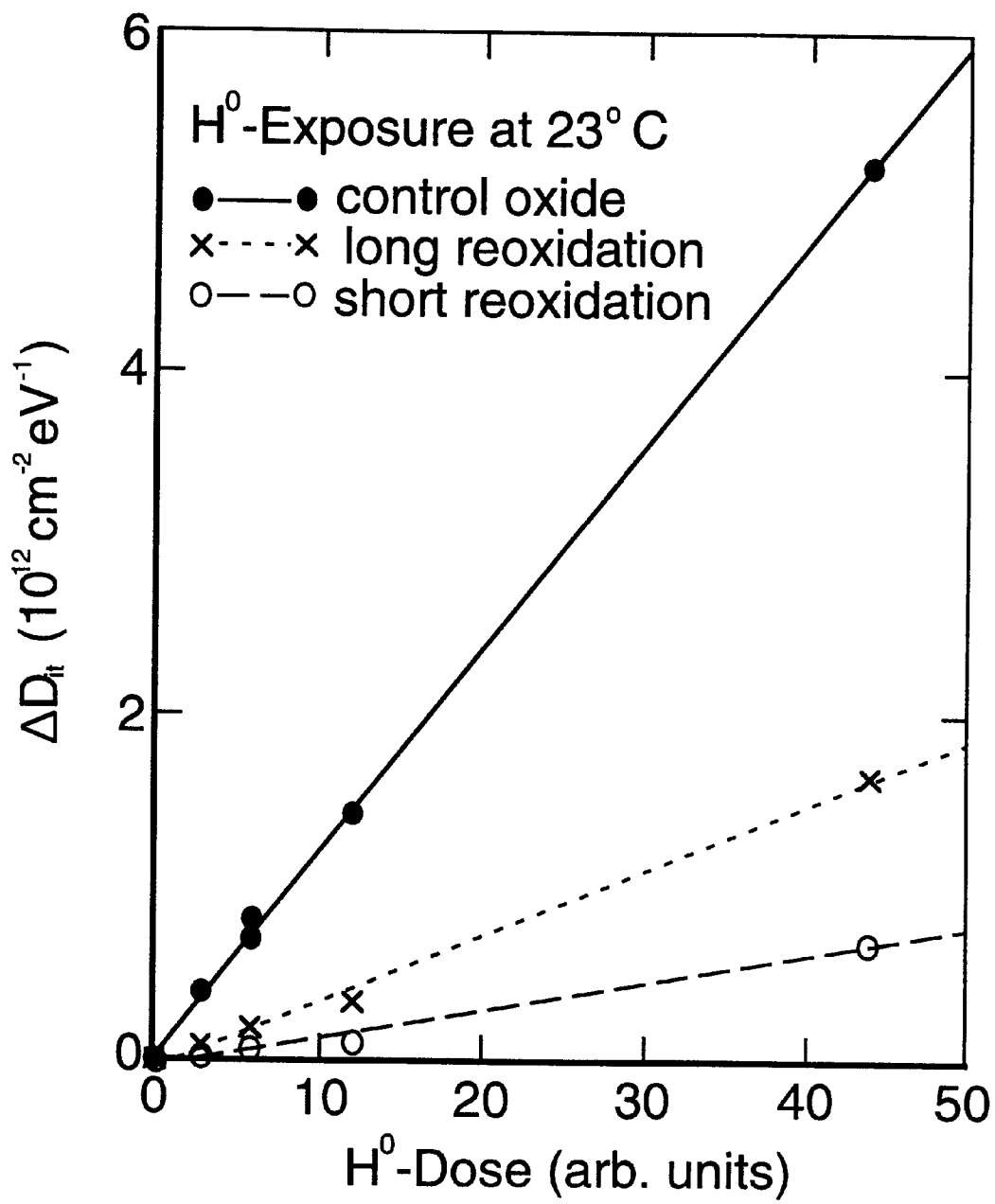
FIG. 4 is a graph of hydrogen dose versus interface state buildup at the substrate/oxide interface.

Equation 12 represents a straight line with a slope β, where β is dependent on dielectric processing conditions, as shown in FIG. 4 for three different processes. Thus for Processes 1 and 2, one can write:

$$\frac{\Delta D_{it1}}{\Delta D_{it2}} = \frac{\Delta D_{it}^x \beta_1 H^o}{\Delta D_{it}^x \beta_2 H^o} = \frac{\beta_1}{\beta_2} \quad (13)$$

where $\beta_1$ and $\beta_2$ are values of β for Processes 1 and 2, respectively, and $\Delta D_{it1}$ and $\Delta D_{it2}$ are the corresponding degradations produced by the same value of hydrogen dose for Processes 1 and 2, respectively.

The hydrogen non-contact stress system can be related to the conventional voltage stress system by Equation 3, producing Equations 14 and 15.

$$\frac{\Delta D_{it1}}{\Delta D_{it2}} = \frac{A_{P1} Q_{inj1}^k}{A_{P2} Q_{inj2}^k} \quad (14)$$

$$\frac{\Delta D_{it1}}{\Delta D_{it2}} = \frac{A_{P1}}{A_{P2}} \quad (15)$$

where $\Delta D_{it1}$ and $AD_{it2}$ are the degradation for Processes 1 and 2, respectively, produced by the same value of injected charge, and $A_{p1}$ and $A_{p2}$ are the values of Ap corresponding to processes 1 and 2. Although equation 13 gives the relative degradation by hydrogen system and equation 15 gives the relative degradation by conventional voltage stress, the degradation is measured the same way for both systems, so Equations 13 and 15 are effectively equivalent. Thus, the constants for Process 2 can be related to those of Process 1 as shown in Equations 16 and 17:

$$\frac{A_{P1}}{A_{P2}} = \frac{\beta_1}{\beta_2} \quad (16)$$

$$A_{P2} = A_{P1} \times \frac{\beta_2}{\beta_1} \quad (17)$$

To find $Q_{bd2}$ for Process 2, in Equation 14, at breakdown both processes will reach the same value of $\Delta D_{it}$ ($\Delta D_{it1}$= $\Delta D_{it2}$), but the ratio of the required injected charges is given by:

$$\left(\frac{Q_{inj1}}{Q_{inj2}}\right)^k = \frac{A_{P2}}{A_{P1}} \quad (18)$$

Equations 17 and 18 can be combined with equation 8 to obtain Equation 19, which relates $Q_{bd2}$ for Process 2 to $Q_{bd1}$ for Process 1:

$$Q_{bd2} = Q_{bd1} \times \frac{Q_{inj2}}{Q_{inj1}} = Q_{bd1} \times \left(\frac{A_{P1}}{A_{P2}}\right)^{1/k}$$

$$Q_{bd2} = Q_{bd1} \times (\beta_1/\beta_2)^{1/k} \quad (19)$$

One can also write:

$$t_{bd2} = \frac{t_{bd1} \times J_1}{J_2} \times (\beta_1/\beta_2)^{1/k} \quad (20)$$

where $t_{bd1}$ and $t_{bd2}$ are the Time-to-Breakdown for Processes 1 and 2, respectively, and $J_1$ and $J_2$ are the current densities for the two processes at the desired operating conditions.

The calibration of the hydrogen stress system with the conventional voltage stress system is done as follows:

(A) Reference stress data is gathered by conventional contacting voltage stress procedures to determine $t_{bd1}$, $Q_{bd1}$, $J_1$, and k for a dielectric produced by a reference process (Process 1). k is the slope of the straight line relating $\Delta D_{it}$ to $Q_{inj}$, as shown in FIG. 3.

(B) The dielectric produced by a reference Process 1 is subjected to the hydrogen non-contact stress system to determine the value of $\beta_1$ from the slope of the straight line relating $\Delta D_{it}$ to hydrogen dose $H^o$ as shown in FIG. 4.

(C) A dielectric produced by a candidate new process (Process 2) is evaluated using the hydrogen non-contact stress system to determine $\beta_2$.

(D) If the dielectric produced by Process 1 has the same thickness as the dielectric produced by Process 2, then equation 20 is used to determine $t_{bd2}$.

Figure 5:
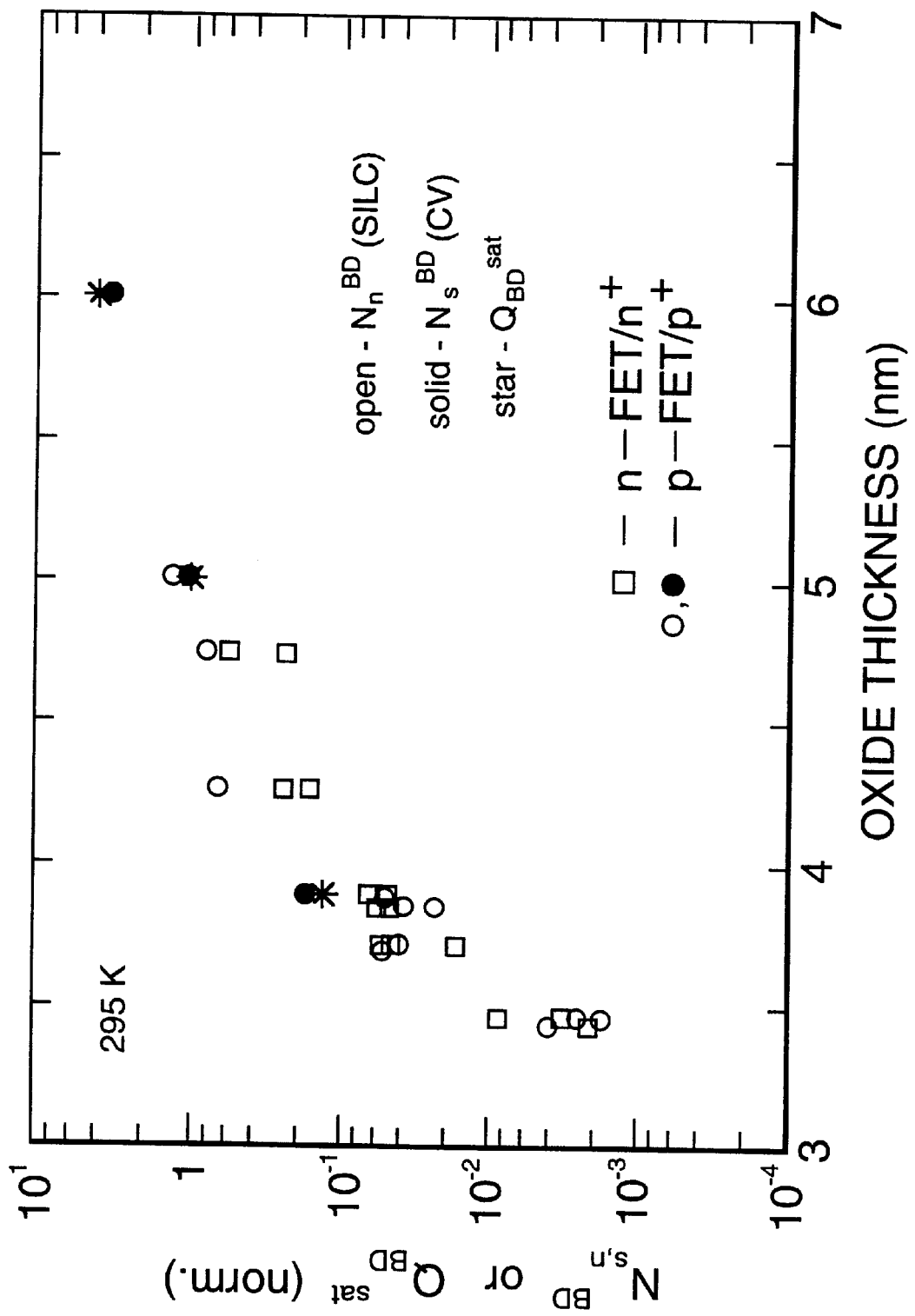
FIG. 5 is a graph of oxide thickness versus critical defect density at breakdown.

(E) If the dielectrics produced by Process 1 and 2 are of different thicknesses, Equation 4 leads to Equation 21:

$$\frac{Q_{bd1}}{Q_{bd2}} = \frac{N_1^{BD} Q_{inj1}}{N_2^{BD} Q_{inj2}} \quad (21)$$

where $N_1^{BD}$ and $N_2^{BD}$ are the thickness-dependent critical defect densities for Processes 1 and 2, respectively, and are given in FIG. 5. Using Equations 18 and 17 with Equation 21, one obtains Equations 22 and 23:

$$Q_{bd2} = Q_{bd1} \times \frac{N_2^{BD}}{N_1^{BD}} \times (\beta_1/\beta_2)^{1/k} \quad (22)$$

$$t_{bd2} = (t_{bd1} \times J_1/J_2) \times (N_2^{BD}/N_1^{BD}) \times (\beta_1/\beta_2)^{1/k} \quad (23)$$

Thus, step 150 as shown in FIG. 2 may comprise comparing the rate of change in interface-state density of the sample wafer to a previously determined rate of change in interface-state density of a reference dielectric on a reference wafer produced by a reference process, where the reference dielectric has a known time-to-breakdown, charge-to-breakdown, stress-induced leakage current, and associated constants as determined via contact voltage stress procedures.

Because lateral transport of atomic hydrogen in large metal-oxide-semiconductor (MOS) capacitors with aluminum or polysilicon gates is extremely limited, gate-free samples are preferably used in the method of this invention. Finger-patterned gate structures with narrow fingers in the sub-micron range may also be used.

The interface-state density is preferably measured by direct wafer probing with a mercury probe using the high-low frequency capacitance-voltage method, or alternatively, by using charge pumping or another suitable method. Other significant dielectric parameters, such as trapped charge and stress-induced leakage current, can also be measured by direct wafer probing with a mercury probe using the high-low frequency capacitance-voltage method.

The method described above may be used to compare at least two sample wafers, each sample wafer manufactured by a different candidate dielectric process. The dielectric process that produces the sample wafer having the highest projected charge-to-breakdown or time-to-breakdown may then be selected as the favored process.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A remote-plasma hydrogen exposure apparatus comprising in series:
   a source of molecular hydrogen gas;
   an atomic hydrogen production unit;
   a particle remover adapted to remove energetic, charged particles;
   a light sink;
   a hydrogen recombination device; and
   a wafer exposure chamber.

2. The remote-plasma hydrogen exposure apparatus of claim 1 wherein the source of the mixture of molecular and atomic hydrogen gas is a plasma source.

3. The remote-plasma hydrogen exposure apparatus of claim 2 wherein the plasma source comprises a microwave discharge in a quartz tube.

4. The remote-plasma hydrogen exposure apparatus of claim 1 wherein the source of the mixture of molecular and atomic hydrogen gas comprises a hydrogen cracker adapted to produce atomic hydrogen from said molecular hydrogen gas.

5. The remote-plasma hydrogen exposure apparatus of claim 4 wherein the hydrogen cracker comprises a hot tungsten filament.

6. The remote-plasma hydrogen exposure apparatus of claim 1 wherein the particle remover is an electrostatic grid across a drift tube, said grid adapted to collect ions of a particular charge according to a voltage polarity on the grid.

7. The remote-plasma hydrogen exposure apparatus of claim 1 wherein the light sink is a transport tube containing light baffles.

8. The remote-plasma hydrogen exposure apparatus of claim 7 wherein the transport tube has interior walls, and said interior walls and said light baffles are coated with a hydrogen recombination inhibitor.

9. The remote-plasma hydrogen exposure apparatus of claim 8 wherein the hydrogen recombination inhibitor is PTFE.

10. The remote-plasma hydrogen exposure apparatus of claim 1 wherein the recombination device is a metal-walled tube having a variable length.

11. The remote-plasma hydrogen exposure apparatus of claim 10 wherein the recombination device comprises a set of bellows.

12. The remote-plasma hydrogen exposure apparatus of claim 1 further comprising a load-lock system adapted to allow a user to exchange a wafer in the wafer exposure chamber without stopping operation of the apparatus.

13. The remote-plasma hydrogen exposure apparatus of claim 1 wherein the recombination device further comprises a pre-exposure chamber in series with the exposure chamber and an exposure valve between said pre-exposure chamber and said exposure chamber.

14. The remote-plasma hydrogen exposure apparatus of claim 13 further comprising a bypass around said exposure valve, said bypass adapted to equalize pressure between said pre-exposure chamber and said exposure chamber without opening said exposure valve.

15. The remote-plasma hydrogen exposure apparatus of claim 13 wherein the pre-exposure chamber further comprises a bolometric sensor.

16. The remote-plasma hydrogen exposure apparatus of claim 15 wherein the bolometric sensor is a silver-coated thermocouple.

17. A remote-plasma hydrogen exposure apparatus comprising in series:
   a source of molecular hydrogen gas;
   an atomic hydrogen production unit comprising a microwave discharge in a quartz tube;
   a particle remover comprising an electrostatic grid across a drift tube, said grid adapted to collect ions of a particular charge according to a voltage polarity on the grid;
   a light sink comprising a transport tube having an interior wall and light baffles, said wall and said baffles coated with PTFE;
   a hydrogen recombination device comprising a set of metal-walled bellows and a pre-exposure chamber having an exposure valve attached thereto;
   a wafer exposure chamber separated from said pre-exposure chamber by said exposure valve;
   a bypass around said exposure valve, said bypass adapted to equalize pressure between said pre-exposure chamber and said exposure chamber without opening said exposure valve; and
   a load-lock system adapted to allow a user to exchange a wafer in the wafer exposure chamber without stopping operation of the apparatus.

* * * * *